(12) United States Patent
Okada et al.

(10) Patent No.: US 10,725,086 B2
(45) Date of Patent: Jul. 28, 2020

(54) EVALUATION APPARATUS OF SEMICONDUCTOR DEVICE AND METHOD OF EVALUATING SEMICONDUCTOR DEVICE USING THE SAME

(71) Applicant: Mitsubishi Electric Corporation, Tokyo (JP)

(72) Inventors: Akira Okada, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 413 days.

(21) Appl. No.: 15/677,245

(22) Filed: Aug. 15, 2017

(65) Prior Publication Data
US 2018/0180659 A1 Jun. 28, 2018

(30) Foreign Application Priority Data
Dec. 22, 2016 (JP) ................................. 2016-248622

(51) Int. Cl.
*G01R 31/26* (2020.01)
*G01R 1/067* (2006.01)

(52) U.S. Cl.
CPC ..... *G01R 31/2601* (2013.01); *G01R 1/06716* (2013.01); *G01R 1/06738* (2013.01)

(58) Field of Classification Search
CPC ............ G01R 1/06716; G01R 1/06738; G01R 31/2601
See application file for complete search history.

(56) References Cited

U.S. PATENT DOCUMENTS

| 5,500,607 | A  | * | 3/1996 | Verkuil | G01R 1/06738 257/E21.531 |
| 2008/0157789 | A1 | * | 7/2008 | Hobbs | G01R 1/06716 324/754.03 |
| 2010/0052709 | A1 | * | 3/2010 | Wills | G01R 1/06738 324/762.05 |
| 2014/0021976 | A1 | * | 1/2014 | Tanaka | G01R 1/07364 324/754.11 |

(Continued)

FOREIGN PATENT DOCUMENTS

| JP | 2001-051011 A | 2/2001 |
| JP | 2003-130889 A | 5/2003 |
| JP | 2010-010306 A | 1/2010 |

*Primary Examiner* — Son T Le
*Assistant Examiner* — Adam S Clarke
(74) *Attorney, Agent, or Firm* — Studebaker & Brackett PC

(57) ABSTRACT

Provided is an evaluation apparatus of a semiconductor device suppressing a discharge occurring in a part of a semiconductor device at a time of evaluating its electrical characteristics. The evaluation apparatus of a semiconductor device includes a stage to support a semiconductor device; a plurality of probes located above the stage; an insulating body having a frame shape to surround the plurality of probes and located above the stage; and an evaluation part injecting a current into the semiconductor device via the plurality of probes. The insulating body includes a tip portion having flexibility and facing the stage. The tip portion includes, in one side surface of the tip portion, a contact surface to come in contact with the semiconductor device by a deformation of the tip portion toward an inner side or an outer side of the frame shape.

19 Claims, 8 Drawing Sheets

(56) References Cited

U.S. PATENT DOCUMENTS

2014/0132300 A1* 5/2014 Cros .................... G01R 1/0716
   324/755.05
2014/0167802 A1* 6/2014 Audette ............. G01R 1/06738
   324/755.07

* cited by examiner

EVALUATION APPARATUS OF SEMICONDUCTOR DEVICE AND METHOD OF EVALUATING SEMICONDUCTOR DEVICE USING THE SAME

BACKGROUND OF THE INVENTION

Field of the Invention

The present invention relates to an evaluation apparatus used for a characteristic evaluation of a semiconductor device and a method of evaluating a semiconductor device using the same.

Description of the Background Art

An evaluation apparatus of a semiconductor device evaluates electrical characteristics of a semiconductor device formed on a semiconductor wafer or a semiconductor device in a chip state divided from a semiconductor wafer. A mounting surface of the semiconductor device, which is a measurement object, comes in contact with and fixed to a surface of a chuck stage in the evaluation device by vacuum suction, for example, at a time of evaluation. Then, a probe of the evaluation apparatus comes in contact with an electrode provided in a portion of a surface where the semiconductor device is not mounted to input and output electrical signals to and from the semiconductor device. When the semiconductor device to be inspected is a vertical semiconductor device flowing a large current in its vertical direction, that is to say, in its out-of-plane direction, the chuck stage in the evaluation device functions as an electrode. A total number of probes has increased in response to a request for applying a large current and high voltage.

When a measurement object is a vertical semiconductor device having a chip shape, a partial discharge phenomenon may occur during the evaluation. For example, the partial discharge occurs by a potential difference between the electrode provided in the portion on which the surface where the semiconductor device is not mounted and a region having the same potential as a side of the chuck stage. Such a discharge causes a partial breakage or defect in the semiconductor device. When such a partial discharge phenomenon is missed in a manufacturing process and the semiconductor device having the defect flows out of a subsequent process as it is as a non-defective product, it is extremely difficult to extract it in the subsequent process. Thus, it is preferable in the evaluation device to suppress the partial discharge previously and take measure to avoid the defect caused by the partial discharge.

Japanese Patent Application Laid-Open Nos. 2003-130889, 2001-51011, and 2010-10306 disclose methods of suppressing the partial discharge described above. A semiconductor inspection equipment disclosed in Japanese Patent Application Laid-Open No. 2003-130889 inspects an electronic component in an isolating solution. Although this semiconductor inspection equipment prevents the discharge occurring during a characteristic inspection of the electronic component, it needs an expensive prober. Moreover, since the semiconductor inspection equipment evaluates the electronic component in the solution, it requires an increased time for the evaluation process and is not therefore appropriate for a cost reduction. When the measurement object is a semiconductor element in a wafer test or a chip test, the insulating solution needs to be completely removed from the semiconductor element after the evaluation. Thus, it is difficult to apply the inspection method described in Japanese Patent Application Laid-Open No. 2003-130889 to such a measurement object.

In an evaluation method disclosed in Japanese Patent Application Laid-Open No. 2001-51011, an inspection is performed by pressing a silicon rubber to an end portion of a semiconductor chip to prevent the discharge. However, since the silicon rubber is pressed by applying pressure on an entire surface of the region of the end portion, a foreign material which has been caught at the time of evaluation or a silicon rubber mark (a rubber mark) is transferred to a surface of the semiconductor chip. These foreign material and silicon rubber mark cause a defect in the subsequent process.

In a semiconductor wafer measurement device disclosed in Japanese Patent Application Laid-Open No. 2010-10306, an insulating member is pressed to a wafer, which is a measurement object, in a manner similar to Japanese Patent Application Laid-Open No. 2001-51011 to prevent the discharge. However, in a manner similar to Japanese Patent Application Laid-Open No. 2001-51011 described above, a foreign material which has been caught at the time of evaluation or a mark caused by a contact of the insulating member is transferred to a surface of the semiconductor chip, and they cause a defect in the subsequent process.

SUMMARY

It is an object to provide an evaluation apparatus of a semiconductor device which suppresses a discharge phenomenon occurring in a part of a region of a semiconductor device, which is a measurement object, at a time of evaluating electrical characteristics of the semiconductor device and further removes a foreign material or a mark caused by a contact of an insulating body to a surface of the semiconductor device.

An evaluation apparatus of a semiconductor device according to the present invention includes a stage which can support a semiconductor device on a main surface; a plurality of probes being located above the main surface of the stage; an insulating body having a frame shape to surround the plurality of probes and being located above the main surface of the stage; and an evaluation part being connected to the plurality of probes and the main surface of the stage and injecting a current into the semiconductor device supported by the main surface of the stage via the plurality of probes to evaluate electrical characteristics of the semiconductor device. The insulating body includes a tip portion which has flexibility and faces the main surface of the stage. The tip portion includes, in one side surface of the tip portion, a contact surface which can come in contact with the semiconductor device by a deformation of the tip portion toward an inner side or an outer side of the frame shape.

According to the above configuration, achievable is to provide an evaluation apparatus of a semiconductor device which suppresses a discharge phenomenon occurring in a part of a region of a semiconductor device, which is a measurement object, at a time of evaluating electrical characteristics of the semiconductor device and further suppresses a foreign material or a transfer of a rubber mark to a surface of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Described are embodiments of an evaluation apparatus of a semiconductor device according to the present invention and a method of evaluating a semiconductor device using the same.

Embodiment 1

Figure 1:
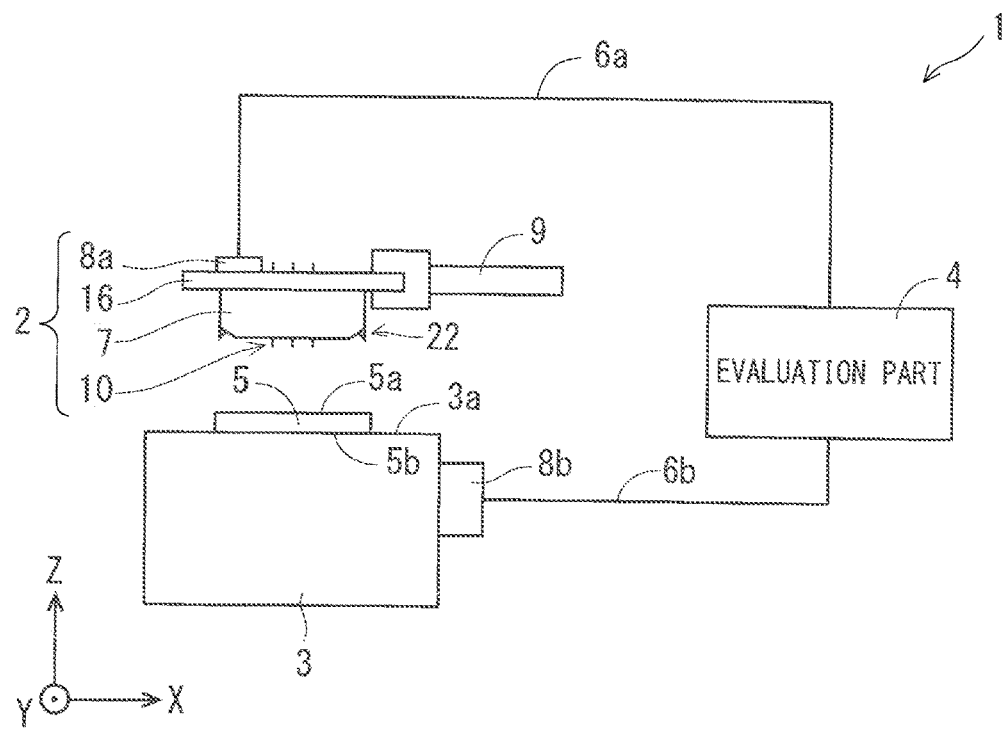
FIG. 1 is a front view schematically illustrating a configuration of an evaluation apparatus according to an embodiment 1.

FIG. 1 is a front view schematically illustrating a configuration of an evaluation apparatus 1 of a semiconductor device according to the embodiment 1. When the evaluation apparatus 1 described in the embodiment 1 evaluates electrical characteristics of a semiconductor device 5, which is a measurement object, a tip portion 22 of an insulating body 7 provided around a probe 10 comes in contact with a surface 5a of the semiconductor device 5. In more detail, the tip portion 22 is in contact with at least a part of an end portion 20 illustrated in FIG. 4 described hereinafter. The evaluation apparatus 1 evaluates the electrical characteristics of the semiconductor device 5 in a state where a creeping distance is elongated by the contact of the tip portion 22 with the end portion 20. After the evaluation, the tip portion 22 cleans the surface 5a of the semiconductor device 5 at a time of moving away from the semiconductor device 5. The evaluation apparatus 1 of the semiconductor device according to the embodiment 1 is described with reference to the drawings.

The evaluation apparatus 1 includes a stage 3 which can support the semiconductor device 5, which is the measurement object, on a main surface 3a and the plurality of probes 10 located above the stage 3. In the embodiment 1, the semiconductor device 5 is a vertical semiconductor device flowing a large current in its vertical direction, that is to say, its out-of-plane direction. The main surface 3a of the stage 3 comes in contact with one electrode (not shown) provided in a lower surface of the semiconductor device 5, that is to say, a mounting surface 5b. At the time of evaluating the electrical characteristics, each probe 10 comes in contact with the other electrode (a surface electrode pad 18 illustrated in FIG. 2 described hereinafter) provided in the surface 5a of the semiconductor device 5. That is to say, the main surface 3a of the stage 3 in the evaluation apparatus 1 functions as one terminal part connected to the semiconductor device 5, and each probe 10 functions as the other terminal part.

The evaluation apparatus 1 further includes an attachment plate 16 to which each probe 10 is attached. A connection part 8a to which a signal wire 6a is connected is provided on the attachment plate 16. Although the illustration is omitted, each probe 10 and the connection part 8a are connected to each other via a wire such as a metal plate provided on the attachment plate 16, for example. When the wire is directly disposed on an outer surface of the attachment plate 16, the attachment plate 16 is preferably formed of an insulating plate. In contrast, when a cable coated with an insulating coat, for example, is used for the wire, the attachment plate 16 may be made of a material which does not have insulation properties such as a metal, for example. The probe 10 is connected to an evaluation part 4 via the wire on the attachment plate 16, the connection part 8a, and the signal wire 6a. In the meanwhile, the main surface 3a of the stage 3 is connected to the evaluation part 4 via a connection part 8b provided on a side surface of the stage 3, and a signal wire 6b attached to the connection part 8b. The evaluation part 4 applies the current to the semiconductor device 5 via each probe 10 to evaluate the electrical characteristics of the semiconductor device 5.

The evaluation apparatus 1 includes the plurality of probes 10 based on an assumption that a large current (5 A or larger, for example) is applied to the semiconductor device 5. When such a large current is applied, a current density added to each probe 10 is required to be substantially the same as each other. Thus, it is preferable that the connection part 8a and the connection part 8b are located in a position in which a distance between the connection part 8a and the connection part 8b is substantially the same via any probe 10. That is to say, those mounting positions are preferably set so that the connection part 8a and the connection part 8b are opposed to each other via each probe 10.

Although the details will be described hereinafter, the evaluation apparatus 1 includes the insulating body 7 located above the stage 3. The insulating body 7 has a frame shape in a planar view, and is provided so that its frame shape surrounds the plurality of probes 10.

The evaluation apparatus 1 includes a probe body 2 which is made up of the probe 10, the attachment plate 16, the connection part 8a, the insulating body 7, and a wire, not shown in the drawings, for connecting each probe 10 and the connection part 8a. The probe body 2 is held by a moving arm 9 and is movable in an optional direction by the moving arm 9. A relative positional relationship between the semiconductor device 5, which is the measurement object, and the probe body 2 can be thereby adjusted. The evaluation apparatus 1 illustrated in FIG. 1 has a configuration that only one moving arm 9 holds the probe body 2, however, the configuration is not limited thereto. The evaluation apparatus 1 may have a configuration that a plurality moving arms stably hold the probe body 2. Alternatively, the semiconductor device 5, that is to say, the stage 3 may be moved by a movement mechanism which is additionally provided in the evaluation apparatus 1, for example, instead of moving the probe body 2 using the movement arm 9. Either configuration enables the adjustment of the relative positional relationship between the semiconductor device 5 and the probe 2.

The stage 3 supports one or the plurality of semiconductor devices 5 by bringing each mounting surface 5b into contact with the main surface 3a. FIG. 1 illustrates an example of providing one semiconductor device 5 for easy description. In the embodiment 1, the stage 3 is a chuck stage and fixes the semiconductor device 5 to the main surface 3a by vacuum suction, for example. The means of fixing the semiconductor device 5 is not limited to the vacuum suction, but an electrostatic suction may also be applicable, for example.

Figure 2:
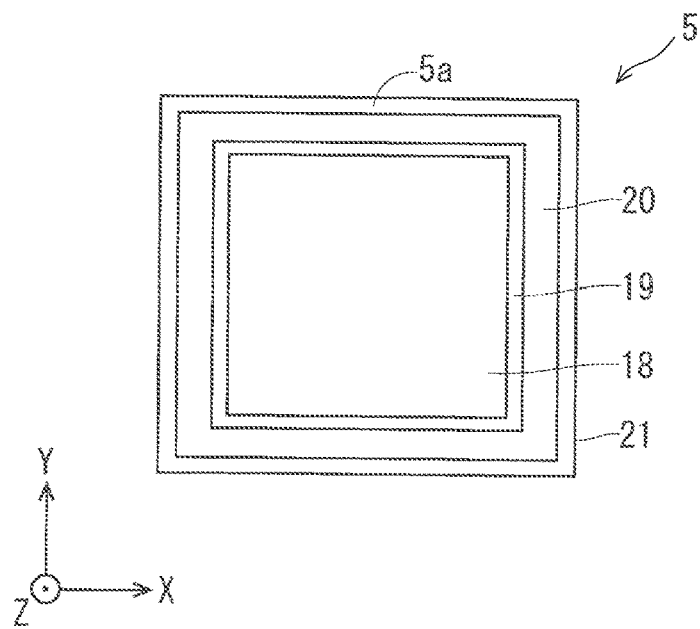
FIG. 2 is a plan view schematically illustrating a semiconductor device, which is a measurement object, according to the embodiment 1.

FIG. 2 is a plan view schematically illustrating an example of the semiconductor device 5, which is the measurement object. As described above, in the embodiment 1, the semiconductor device 5 is the vertical semiconductor device flowing the large current in its vertical direction, that is to say, its out-of-plane direction. The semiconductor device 5 is an IGBT or a MOSFET, for example, but is not limited to them. The semiconductor device 5 is divided into an active region 19 and the end portion 20 in a planar view. The end portion 20 is provided in an outer peripheral portion within a dicing line of one semiconductor device 5 to secure a withstand voltage of the semiconductor device 5. The active region 19 is provided inside the semiconductor device 5 to form a desired element such as a vertical IGBT, for example. The surface electrode pad 18 is provided in the surface 5a of the semiconductor device 5, more specifically, a surface of the active region 19. Although the illustration is omitted, a rear surface electrode pad is provided in the mounting surface 5b of the semiconductor device 5. The surface electrode pad 18 and the rear surface electrode pad can be connected to the outside, and a carrier is injected into the active region 19 from the outside via those electrode pads. When the semiconductor device 5 is a vertical IGBT, the surface electrode pad 18 functions as an emitter electrode and gate electrode, and the rear surface electrode pad functions as a collector electrode. The surface electrode pad 18 is formed of a conductive material, and is made of aluminum, for example. Since the semiconductor device 5 illustrated in FIG. 2 is an example, a position and number of emitter electrodes and gate electrodes disposed in the surface and collector electrodes disposed in the rear surface are not limited thereto.

Figure 3:
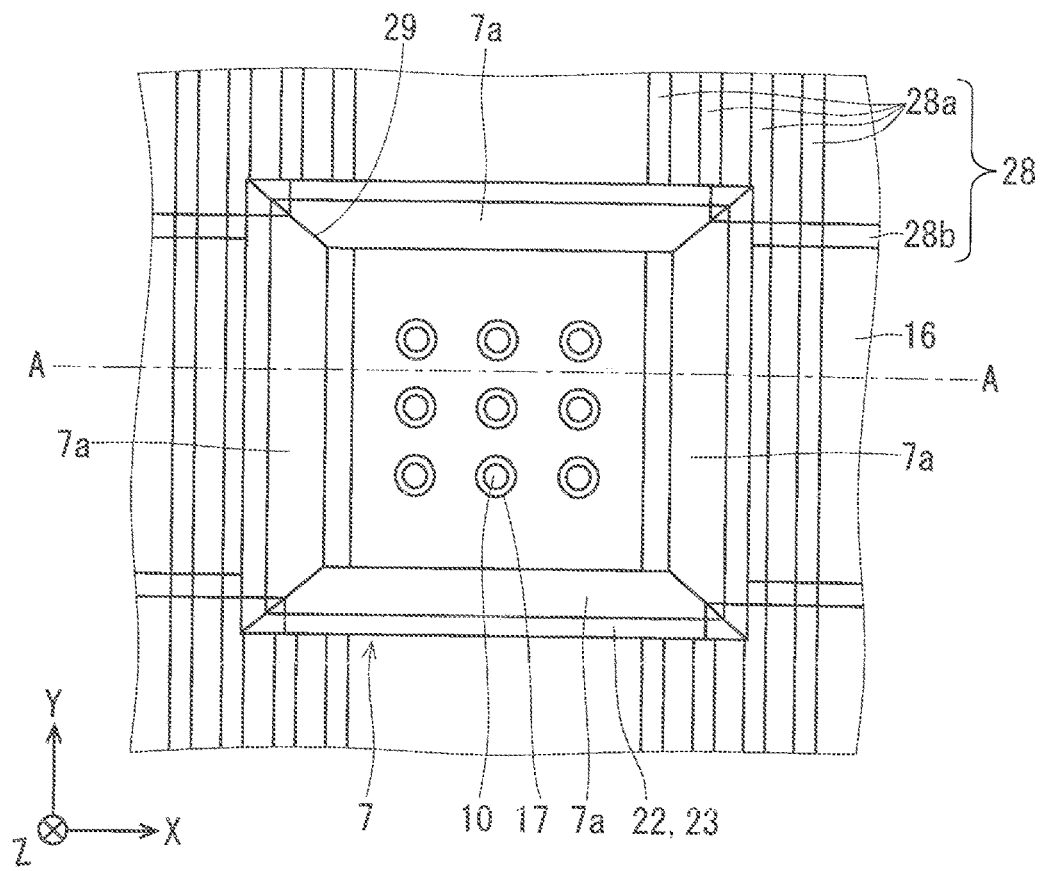
FIG. 3 is a plan view illustrating a part of a probe body according to the embodiment 1.
Figure 4:
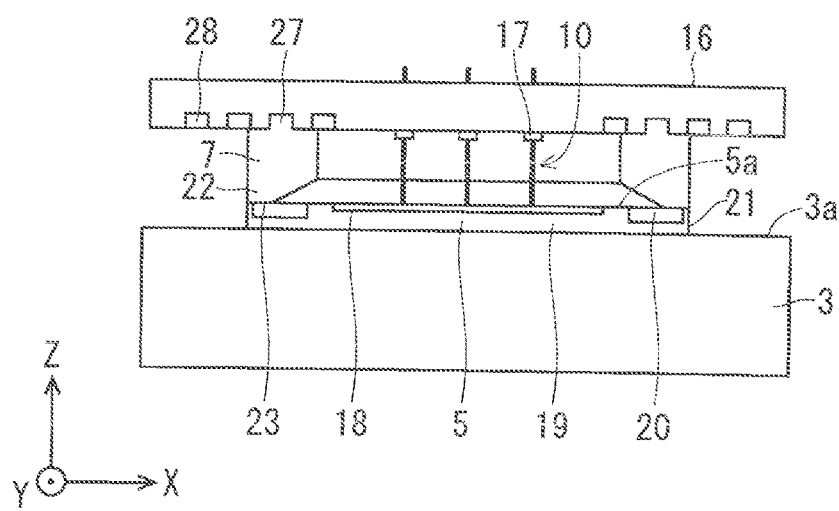
FIG. 4 is a cross-sectional view illustrating a part of the evaluation apparatus at a time of evaluation according to the embodiment 1.
Figures 5A, 5B, 5C:
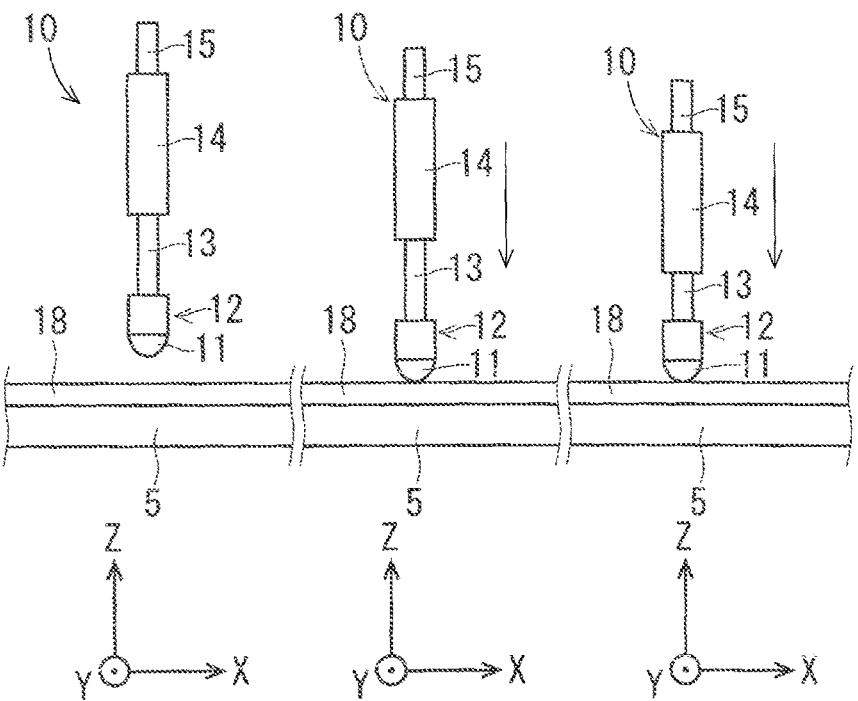
FIGS. 5A to 5C are front views illustrating a configuration and operation of the probe according to the embodiment 1.

FIG. 3 is a plan view illustrating a part of the probe body 2. FIG. 3 is a view of observing the attachment plate 16 on which the probe 10 and the insulating body 7 are disposed from a side of the stage 3. FIG. 4 is a cross-sectional view of the stage 3 and attachment plate 16 in a position indicated by a line A-A illustrated in FIG. 3. FIG. 4 illustrates a part of the evaluation apparatus 1 at the time of evaluating the electrical characteristics of the semiconductor device 5, and the probe 10a and the insulating body 7 are in contact with the semiconductor device 5. The probe 10 is removably held by a socket 17 provided on the attachment plate 16. FIG. 5A is a front view of the probe 10. A body mounting part 14 provided in the probe 10 is held by the socket 17 on the attachment plate 16 illustrated in FIG. 4. The probe 10 is connected to the attachment plate 16 via the socket 17, thereby being able to be attached to and detached from the attachment plate 16. For example, the number of probes 10 can be changed easily in accordance with a size of the semiconductor device 5 to be evaluated, or a broken probe 10 can be replaced easily.

As illustrated in FIG. 5A, the probe 10 is made up of the body mounting part 14 connected to the attachment plate 16, a head part 12, a pressing-in part 13, and an electrical connection part 15. The head part 12 has a contact part 11 which can be mechanically and electrically in contact with the surface electrode pad 18 provided on the surface 5a of the semiconductor device 5. The pressing-in part 13 is slid by a spring part having a built-in spring or the like inside the probe 10 when the contact part 11 comes in contact with the surface electrode pad 18. The electrical connection part 15 has an electrical conduction to the head part 12 and functions as an output end to the evaluation part 4. The probe 10 has conductivity. The probe 10 is made of a metal material such as copper, tungsten, or rhenium tungsten, for example, but is not limited to them. In particular, the contact part 11 may be coated with the other member such as gold, palladium, tantalum, platinum, or the like for purpose of enhancing conductivity and ruggedness, for example.

FIG. 5B and FIG. 5C are front views illustrating an operation of the probe 10 illustrated in FIG. 5A. The probe 10 moves down from an initial state illustrated in FIG. 5A in a direction of the surface electrode pad 18 of the semiconductor device 5, that is to say, in a −Z direction illustrated by an arrow. FIG. 5B illustrates a state where the contact part 11 of the probe 11 is in contact with the surface electrode pad 18. FIG. 5C illustrates a state where the probe 10 further moves down, and the pressing-in part 13 is pressed into the body mounting part 14 via the spring part. The pressing-in part 13 is pressed into the body mounting part 14, whereby the contact part 11 of the probe 10 reliably comes in contact with the surface electrode pad 18 of the semiconductor device 5.

Although the operation of the probe 10 which has the spring part having the slidability in a Z direction therein is described herein, a mechanism providing the slidability to the probe 10 is not limited to the mechanism described above. The mechanism may have the spring part outside. Moreover, the mechanism includes not only the spring system, but a contact probe having a cantilever system may also be applied. The mechanism includes not only the spring system, but a laminated probe or a wire probe may also be applied as long as a mechanism has the slidability in the Z direction.

As illustrated in FIG. 1 and FIG. 4, the evaluation apparatus 1 further includes the insulating body 7 above the main surface 3a of the stage 3. The insulating body 7 is held by the attachment plate 16. As illustrated in FIG. 3, the insulating body 7 has the frame shape. The insulating body 7 is disposed in the attachment plate 16 so that the frame shape surrounds the plurality of probes 10. The frame shape of the insulating body 7 has a shape of surrounding an outer shape of the semiconductor device 5 to be evaluated. In particular, the insulating body 7 has a shape of surrounding the active region 19 of the semiconductor device 5 at the time of evaluating the semiconductor device 5. In the embodiment 1, the outer shape of the semiconductor device 5 forms a square as illustrated in FIG. 2, thus the frame shape of the insulating body 7 also forms a square as illustrated in FIG. 3.

The insulating body 7 may be made up of the plurality of insulating parts 7a. That is to say, the frame shape of one insulating body 7 may be formed by combining the plurality of insulating parts 7a. For example, one side in a plurality of sides which form the outer shape of the semiconductor device 5 and one insulating part 7a in the plurality of insulating parts 7a which constitute the insulating body 7 correspond to each other to form the frame shape of the insulating body 7. As described above, since the frame shape is formed by the plurality of insulating parts 7a, the evaluation apparatus 1 can include the insulating body 7 flexibly having various frame shapes. The insulating body 7 illustrated in FIG. 3 is made up of the four insulating parts 7a, corresponding to each side forming the square of the semiconductor device 5. Each of the insulating parts 7a is disposed to be in planar contact with the other one at an adjacent portion 29 where the insulating parts 7a are adjacent to each other. In particular, each of the insulating parts 7a is closely disposed to be in planar contact with the other one at the adjacent portion 29 at the time of evaluating the semiconductor device 5.

As illustrated in FIG. 4, the insulating body 7 is fitted into at least one groove 28 provided in one surface, that is to say, the lower surface of the attachment plate 16. A fitting part 27 having a protruding shape to be fitted into the groove 28 is provided in an upper part of the insulating body 7, that is to say, a side closer to the attachment plate 16. The insulating body 7 is removably fixed to the attachment plate 16 by the groove 28 and the fitting part 27. In the embodiment 1, the plurality of grooves 28 are provided in the attachment plate 16. Each fitting part 27 provided in each insulating part 7a is disposed to be fitted into one groove 28 selected from the plurality of grooves 28. In FIG. 3, the number of grooves 28a extending in a Y direction is larger than that of grooves 28b extending in an X direction, however, it is also applicable to provide a large number of grooves 28 extending in the X direction.

The insulating body 7 is made by an elastic body having the insulation properties. For example, the insulating body 7 is made by a silicon rubber or a fluorine-contained rubber, but the material of the insulating body 7 is not limited to them. Since the semiconductor device 5 can be evaluated at high temperature of approximately 200° C., for example, the insulating body 7 is preferably made by a material having resistance to such a high temperature. The fluorine-contained rubber can be used at such a high temperature. The insulating body 7 or each insulating part 7a is preferably formed by a molding processing. In particular, when the plurality of insulating parts 7a having the same shape are formed, the molding processing is preferable by reason that it can be performed at low cost.

Figure 6:
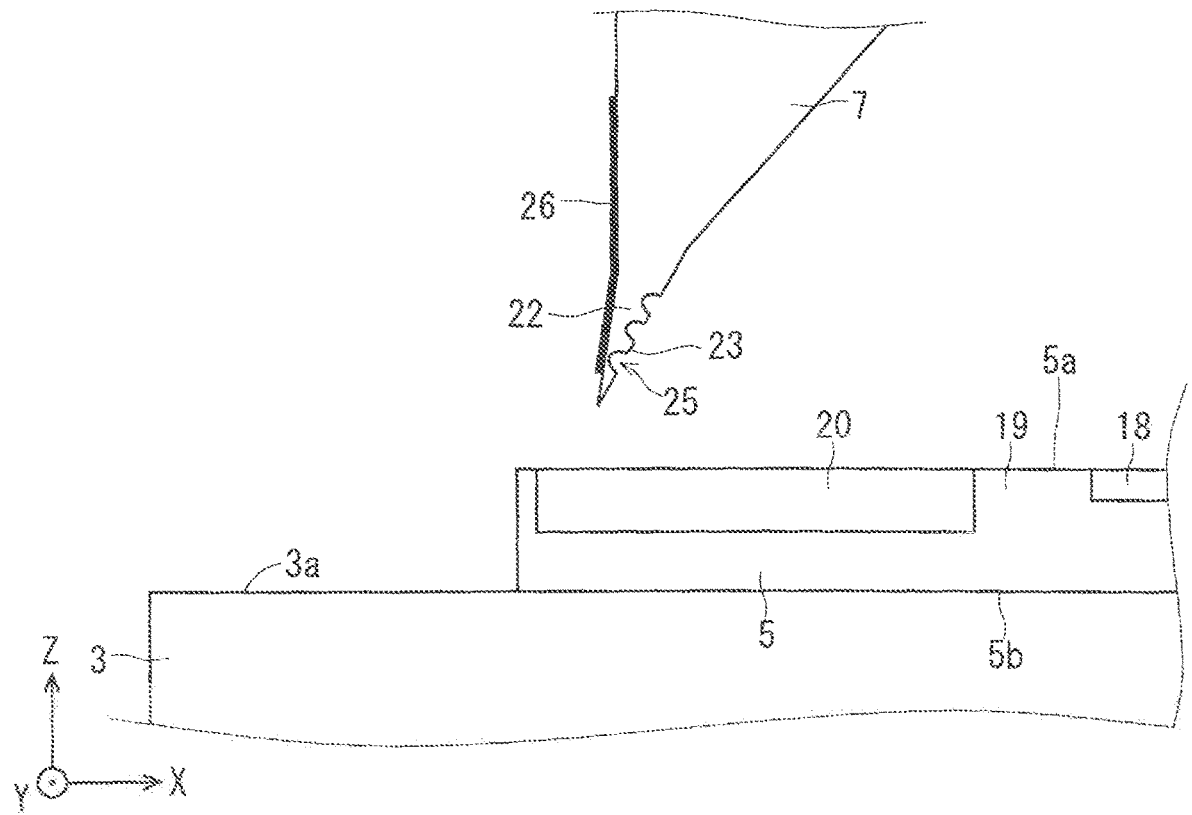
FIG. 6 is a cross-sectional view illustrating a tip portion of an insulating body according to the embodiment 1.
Figure 7:
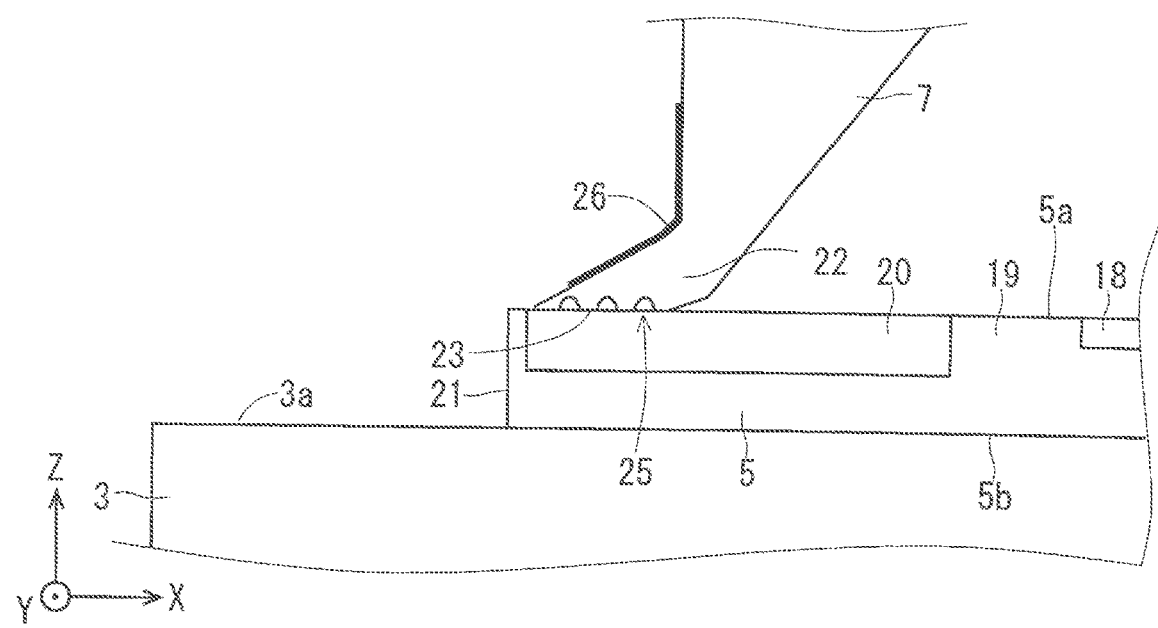
FIG. 7 is a cross-sectional view illustrating the tip portion of the insulating body at a time of the evaluation according to the embodiment 1.

As illustrated in FIG. 4, the insulating body 7 includes the tip portion 22 which has flexibility and faces the main surface 3a of the stage 3. FIG. 6 is a cross-sectional view of enlarging the tip portion 22 of the insulating body 7. The tip portion 22 has a tapered shape tapering toward the main surface 3a of the stage 3. The tip portion 22 includes a contact surface 23 in one side surface. In the embodiment 1, the contact surface 23 is located in an inner side of the frame shape of the insulating body 7. In FIG. 6, a +X direction indicates the inner side of the frame shape of the insulating body 7. FIG. 7 is a view illustrating a state of the tip portion 22 at the time of evaluating the electrical characteristics of the semiconductor device 5. The tip portion 22 comes in contact with the semiconductor device 5 at the time of the evaluation and then is curved by its flexibility. Its curved direction is the same as a direction toward an outer side of the frame shape of the insulating body 7 in the embodiment 1. In FIG. 7, the −X direction indicates the outer side of the frame shape of the insulating body 7. The tip portion 22 is deformed toward the outer side of frame shape, thereby the contact surface 23 of the tip portion 22 comes in contact with at least a part of the end portion 20 of the semiconductor device 5. The contact surface 23 of the tip portion 22 is preferably in contact with only the part of the end portion 20 of the semiconductor device 5.

It is preferable in the embodiment 1 that the tip portion 22 has a tapered shape slightly curved to the outer side of the frame shape of the insulating body 7 in a state where the tip portion 22 is not in contact with the semiconductor device 5, that is to say, in a state illustrated in FIG. 6. It is because the tip portion 22 is curved outside and the contact surface 23 can reliably come in contact with the semiconductor device 5 at the time of evaluating the semiconductor device 5 illustrated in FIG. 7.

A plurality of concave portions 25 are provided in the contact surface 23 of the tip portion 22. Although the tip portion 22 illustrated in FIG. 6 and FIG. 7 has the three concave portions 25, each concave portion 25 may be a groove along the frame shape of the insulating body 7 or a groove extending in the Y direction in FIG. 6, for example. A plurality of circular concave portions 25 may be provided in the contact surface 23. Furthermore, the concave portions 25 may be disposed in the contact surface 23 in a staggered pattern or a zigzag pattern for purpose of increasing the number of concave portions 25 disposed in the contact surface 23. The concave portions 25 have a function of removing the foreign material or the mark caused by the contact on a contact portion when the contact of the contact surface 23 with the surface 5a of the semiconductor device 5 is released. The plurality of concave portions 25 provided in the surface of the contact surface 23 also have an effect of reducing an area of contact between the contact surface 23 and the end portion 20.

As illustrated in FIG. 6 and FIG. 7, the insulating body 7 includes at least one spring member 26 on the tip portion 22. The illustration of the spring member 26 is omitted in FIG. 1 described above. The spring member 26 is provided on the other side surface opposite to one side surface of the tip portion 22 where the contact surface 23 is located. The spring member 26 is adhesively disposed on the other side surface of the tip portion 22, for example. In the embodiment 1, the spring member 26 is individually provided on each side constituting the frame shape of the insulating body 7. That is to say, the plurality of spring members 26 are provided on the insulating body 7. It is preferable that each spring member 26 is slightly curved outside in the state where the tip portion 22 is not in contact with the semiconductor device 5 in accordance to the tapered shape of the tip portion 22. It is because the tip portion 22 is curved so that the contact surface 23 comes in contact with the semiconductor device 5 at the time of evaluating the semiconductor device 5. Each spring member 26 has a plate-like shape and is easily mounted on the side surface of the tip portion 22.

The spring member 26 provides the elasticity to the tip portion 22. The spring member 26 bends with the tip portion 22 in accordance with the curved state of the tip portion 22. The spring member 26 maintains the curved state when the contact surface 23 of the tip portion 22 is in contact with the surface 5a of the semiconductor device 5. When the contact of the contact surface 23 is released, the spring member 26 brings the deformed tip portion 22 back into the original state.

Figure 8:
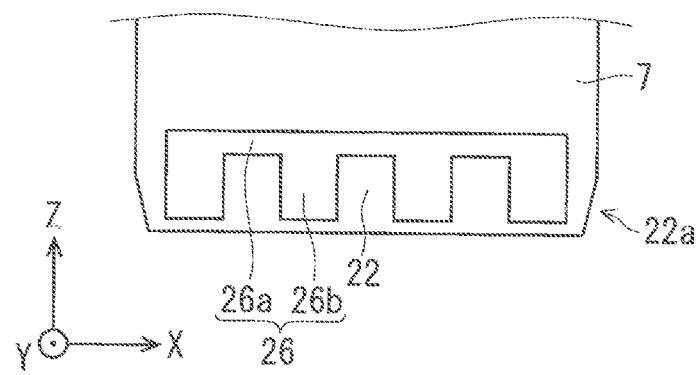
FIG. 8 is a front view illustrating an example of a spring member according to the embodiment 1.
Figure 9:
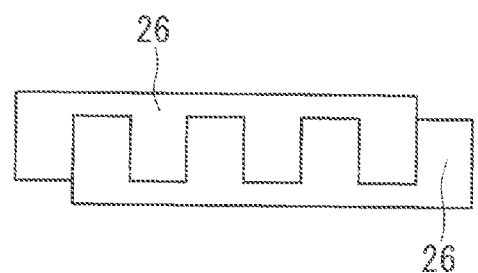
FIG. 9 is a view illustrating a method of manufacturing the spring member according to the embodiment 1.

FIG. 8 is a front view illustrating an example of the spring member 26 disposed on the other side surface of the insulating body 7. The spring member 26 has a shape in which at least one first rectangle 26a and at least one second rectangle 26b having a larger area than that of the first rectangle 26a are alternately connected to each other in a surrounding direction of the frame shape of the insulating body 7. Each one edge of the first rectangle 26a and second rectangle 26b closer to the attachment plate 16 is connected to the other edge at the same height. The shape of the spring member 26 illustrated in FIG. 8 provides a substantially equal elasticity to any position in the tip portion 22 located in one side of the insulating body 7. As a method of manufacturing the spring member 26, the two spring members 26 can be cut out from one plate member to be manufactured. FIG. 9 illustrates a state where the two spring member 26 is formed of one plate material. Such a manufacturing method enables a suppression of a waste of the plate material. Thus, the spring member 26 can be manufactured at low cost.

Figure 10:
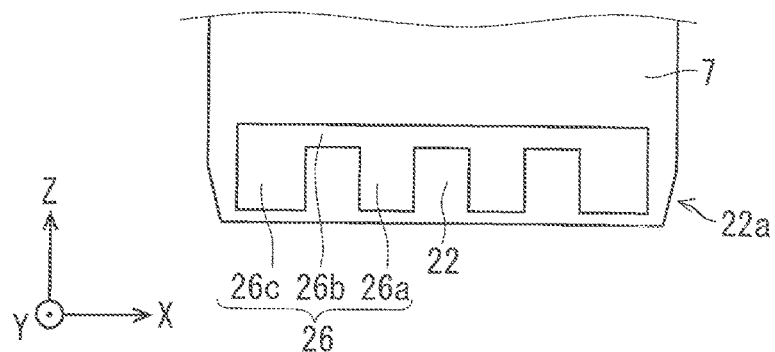
FIG. 10 is a front view illustrating another example of a spring member according to the embodiment 1.

The shape of the spring member 26 is not limited to the shape illustrated in FIG. 8. FIG. 10 is a front view illustrating another example of the spring member 26. The spring member 26 illustrated in FIG. 10 has a shape in which a third rectangle 26c having an area larger than that of the second rectangle 26b is connected to both ends of each side in the frame shape of the insulating body 7. In the embodiment 1, the third rectangle 26c has a width larger than that of the second rectangle 26b. Each one edge of the first rectangle 26a, second rectangle 26b, and third rectangle 26c closer to the attachment plate 16 is connected to the other edge at the same height. The third rectangle 26c is located near an edge of the side surface of the insulating body 7. The spring member 26 illustrated in FIG. 10 increases the elasticity in the both ends of each side constituting the frame shape of the insulating body 7. In particular, cutting portions 22a are provided not to prevent the tip portion 22 from being curved at the time of coming in contact with the surface 5a of the semiconductor device 5 in both ends of each side constituting the frame shape. In the above case, the elasticity in the tip portion 22 located near the cutting portions 22a is reduced. In the spring member 26 illustrated in FIG. 10, the third rectangle 26c makes up for the elasticity even when the cutting portions 22a are provided in the tip portion 22. The elasticity of the third rectangle 26c causes a movement of the tip portion 22 located near the cutting portions 22a to follow a movement of a central part of the tip portion 22.

The spring member 26 illustrated in FIG. 8 or FIG. 10 is provided to extend from one end to the other end in each side constituting the frame shape of the insulating body 7, but may also be disposed in only the end of one side or only a central part of one side.

In the embodiment 1, the spring member 26 is made of a member different from that of the insulating body 7. The spring member 26 is made of a metal, for example. The metal includes a metal such as spring steel, brass, or phosphor bronze, for example, used for a thin plate spring, but is not limited to them. In view of the evaluation of the semiconductor device 5 under high temperature condition, the spring member 26 may also be made of a resin material having heat resistance such as PPS, for example.

Figure 11:
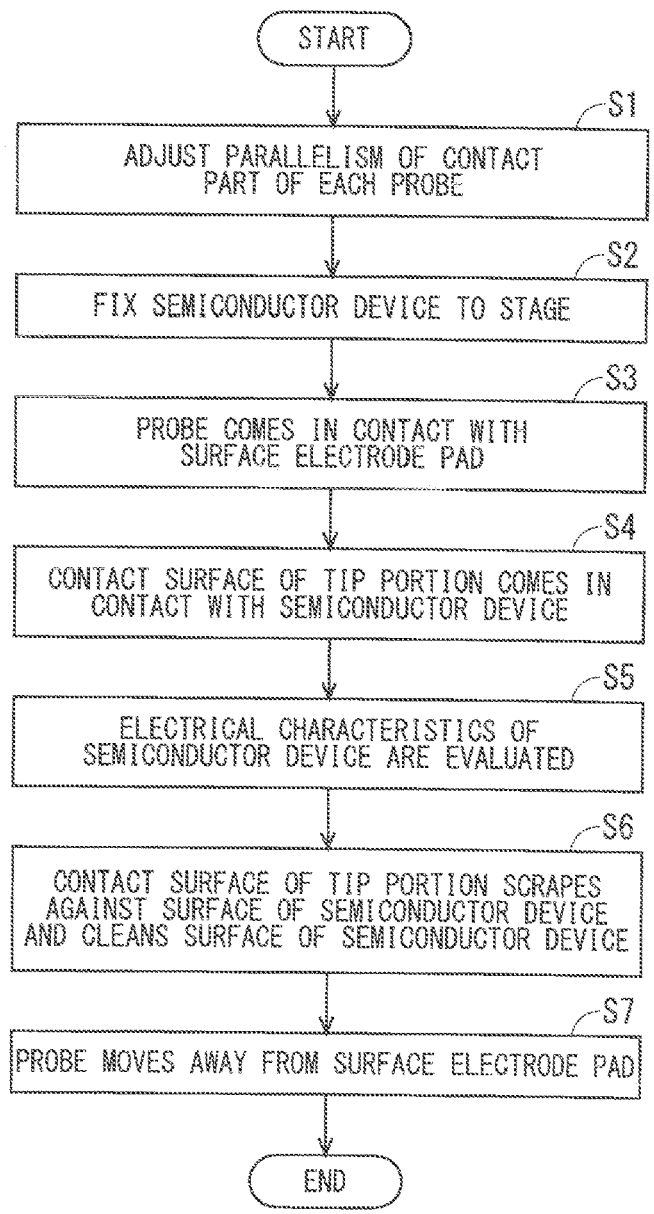
FIG. 11 is a flow chart showing an operation of the evaluation apparatus according to the embodiment 1.

Next, an operation of the evaluation apparatus 1 of the semiconductor device described in the embodiment 1 is described. FIG. 11 is a flow chart showing the operation of the evaluation apparatus 1 of the semiconductor device. When the evaluation apparatus 1 includes the plurality of probes 10 as is the case for the embodiment 1, parallelism of the contact part 11 of each probe 10 is equalized before the evaluation (Step S1). The mounting surface 5b of the semiconductor device 5 which is the measurement object is fixed to the main surface 3a of the stage 3 (Step S2).

Each probe 10 is moved with the probe body 2 by the movement arm 9 so that the contact part 11 of each probe 10 comes in contact with the surface electrode pad 18 (Step S3). The tip portion 22 of the insulating body 7 comes in contact with the semiconductor device 5 and is then curved as illustrated in FIG. 7. At this time, the tip portion 22 is deformed toward the outer side of frame shape, thereby the contact surface 23 of the tip portion 22 is pressed to and then comes in contact with at least a part of the end portion 20 of the semiconductor device 5 (Step S4). At this time, the contact surface 23 of the tip portion 22 is preferably in contact with only the part of the end portion 20 of the semiconductor device 5. Step S4 is a contact step. This Step S4 is performed after Step S3 or simultaneously with Step S3. That is to say, the contact between the insulating body 7 and the end portion 20 is performed after or simultaneously with the contact between the probe 10 and the surface electrode pad 18. This enables the reliable contact between the probe 10 and the surface electrode pad 18.

Subsequently, a desired evaluation of the electrical characteristics is performed (Step S5). Step S5 is an evaluation step. That is to say, the current is injected into the semiconductor device 5 via each probe 10 to evaluate the electrical characteristics of the semiconductor device.

At the time of the evaluation in Step S5, a potential of the main surface 3a of the stage 3, a potential of the mounting surface 5b of the semiconductor device 5, and a potential of an outer peripheral surface 21 of the semiconductor device 5 are the same as each other. When the stage 3 has a high potential, the surface electrode pad 18 closer to the active region 19 via the end portion 20 has a low potential. A potential difference between them may cause a partial discharge. However, in the evaluation apparatus 1 of the embodiment 1, the voltage is applied in a state where the insulating body 7 is in contact with the end portion 20. Since the insulating body 7 is in contact with the end portion 20, a creeping distance is elongated, and the occurrence of the discharge is suppressed.

Although the creeping distance needs to be elongated to suppress the discharge, there is no need to cause the entire surface of the end portion 20 to come in contact with the insulating body 7. An area of contact with the end portion 20 closer to the insulating body 7 is enlarged to correspond to the semiconductor device 5 having the different outer shape, that is to say, the different end portion 20, thereby there is no need to prepare a large number of insulating bodies having the different sizes. However, when the area of contact between the contact surface 23 and the semiconductor device 5 is enlarged, concerned at the time of the evaluation are the increase in the foreign materials caught between the contact surface 23 and the semiconductor device 5 and the increase in the area of the mark caused by the contact. As a result, a probability of defect occurring in the semiconductor device 5 increases in a manufacture process after this evaluation process.

Thus, in the evaluation apparatus 1 of the embodiment 1, the contact surface 23 located on the part of the insulating body 7 is in contact only with the part of the end portion 20. Accordingly, the increase in the caught foreign materials and the increase in the area of the mark caused by the contact are suppressed at the time of the evaluation. As illustrated in FIG. 4 and FIG. 7, the part of the end portion 20 located near the outer peripheral surface 21 of the semiconductor device 5 and the contact surface 23 of the insulating body 7 come in contact with each other. The evaluation apparatus 1 increases the creeping distance at a side of higher potential, thereby suppressing the discharge effectively.

After evaluating the electrical characteristics, the probe body 2 is moved up by the movement arm 9, thereby the contact surface 23 of the tip portion 22 moves away from the end portion 20 (Step S6). Step S6 is a retraction step. The probe 10 moves away from the surface 5a of the semiconductor device 5 (Step S7). In Step S6, the contact surface 23 strongly scrapes against the end portion 20 due to the elasticity of the spring member 26 and then moves away from the surface 5a of the semiconductor device 5. When there is the foreign material in the area against which the contact surface 23 scrapes, the foreign material is caught by the concave portion 25 and is thereby removed from the surface 5a of the semiconductor device 5. A part of the mark caused by the contact is also wiped from the surface 5a of the semiconductor device 5. As described above, the surface 5a of the semiconductor device 5 is cleaned by the tip portion 22 of the insulating body 7. Step S7 may be performed simultaneously with Step S6 or after Step S6.

To summarize the above, the evaluation apparatus 1 of the semiconductor device according to the embodiment 1 includes the stage 3 which can support the semiconductor device 5 on the main surface 3a, the plurality of probes 10 being located above the main surface 3a of the stage 3, the insulating body 7 having the frame shape to surround the plurality of probes 10 and being located above the main surface 3a of the stage 3, and the evaluation part 4 being connected to the plurality of probes 10 and the main surface 3a of the stage 3 and injecting a current into the semiconductor device 5 supported by the main surface 3a of the stage 3 via the plurality of probes 10 to evaluate electrical characteristics of the semiconductor device 5. The insulating body 7 includes the tip portion 22 which has the flexibility and faces the main surface 3a of the stage 3. The tip portion 22 includes, in one side surface of the tip portion 22, the contact surface 23 which can come in contact with the semiconductor device 5 by the deformation of the tip portion 22 toward the outer side of the frame shape.

According to the configuration described above, in the evaluation apparatus 1, the contact surface 23 provided in the part of the insulating body 7 comes in contact with the part of the end portion 20, particularly in the side of high potential. Accordingly, the evaluation apparatus 1 effectively increases the creeping distance, thereby suppressing a spark discharge. Furthermore, the insulating body 7 comes in contact not with the entire surface of the end portion 20 or outer peripheral surface 21 of the semiconductor device 5 but with the part of the end portion 20. Since the area of contact is sufficiently reduced, it is possible to reduce the foreign material or the area of the mark transferred to the surface 5a of the semiconductor device 5 due to the contact of the insulating body 7, thus a defective appearance is suppressed. When the tip portion 22 moves away from the surface 5a of the semiconductor device 5, the foreign material on the surface 5a is removed. As described above, the evaluation apparatus 1 suppresses the foreign material and the transfer of the mark caused by the contact to the surface 5a of the semiconductor device 5.

Moreover, the frame shape of the insulating body 7 included in the evaluation apparatus 1 of the semiconductor device is formed by combining the plurality of insulating parts 7a. Such a configuration enables the insulating body 7 to form various flexible frame shapes in accordance with the outer shape of the semiconductor device 5. When the defect occurs in the insulating body 7, only the insulating part 7a having the defect can be replaced, so that the cost is reduced.

The tip portion 22 included in the evaluation apparatus 1 of the semiconductor device is made of the elastic body. According to such a configuration, when the contact between the contact surface 23 of the tip portion 22 and the surface 5a of the semiconductor device 5 is released, the elasticity of the tip portion 22 itself brings the deformed tip portion 22 to back into the original state. The tip portion 22 cleans the surface 5a at the time of moving away from the surface 5a. The foreign material and the transfer of the mark caused by the contact to the surface 5a of the semiconductor device 5 are suppressed.

The insulating body 7 included in the evaluation apparatus 1 of the semiconductor device further includes at least one spring member 26 having a plate-like shape. The spring member 26 is included in the tip portion 22 to provide the elasticity to the tip portion 22, thereby bringing the deformed tip portion 22 back into the original state. According to the above configuration, when the tip portion 22 moves away from the insulating body 7, the elasticity of the deformed or curved spring member 26 is released, thereby the contact surface 23 reliably scrapes against the surface 5a of the semiconductor device 5, and the effect of removing the foreign material is improved.

At least the part of the spring member 26 included in the evaluation apparatus 1 of the semiconductor device is provided on the other side surface of the tip portion 22 opposite to one side surface of the tip portion 22 where the contact surface 23 is located. According to the above configuration, the spring member 26 can be mounted and replaced easily.

The spring member 26 included in the evaluation apparatus 1 of the semiconductor device has the shape in which at least the one first rectangle 26a and at least the one second rectangle 26b having the larger area than that of the first rectangle 26a are alternately connected to each other in the surrounding direction of the frame shape of the insulating body 7. The spring member 26 having such a configuration enables the substantially equal application of the elasticity to the whole tip portion 22 in one side of the insulating body 7. The elasticity applied to the tip portion 22 by the spring member 26 can be adjusted by adjusting a ratio between a size of the first rectangle 26a and a size of the second rectangle 26b, for example. In the method of manufacturing the spring member 26, the material can be efficiently used, and the cost can be reduced.

Moreover, the insulating body 7 included in the evaluation apparatus 1 of the semiconductor device further includes a plurality of spring members 26. The frame shape of the insulating body 7 is formed of the plurality of sides. Each spring member 26 is provided on each side and has a shape in which the third rectangle 26c having the area larger than that of the second rectangle 26b is connected to the both ends thereof When the cutting portions 22a are provided in the both ends of the side surface of the insulating body 7, the return of the deformed shape may be suppressed near the both ends. The insulating body 7 including the above configuration increases the elasticity at the both ends to enhance the return of them.

Moreover, the insulating body 7 included in the evaluation apparatus 1 of the semiconductor device further includes the plurality of spring members 26. The frame shape of the insulating body 7 is formed of the plurality of sides. Each spring member 26 is provided only in the end of each side. When the cutting portions are provided in the both ends of the side surface of the insulating body 7, the return of the deformed shape may be suppressed at the both ends. The insulating body 7 including the above configuration increases the elasticity at the both ends to enhance the return of them. Since the spring member 26 is provided only in the end of each side, the spring member 26 can be manufactured at low cost.

Moreover, the insulating body 7 included in the evaluation apparatus 1 of the semiconductor device further includes the plurality of spring members 26. The frame shape of the insulating body 7 is formed of the plurality of sides. Each spring member 26 is provided only in a central part of each side. The spring member 26 having such a configuration is short in length. Since the material of the spring member 26 is reduced, the cost is reduced.

Moreover, the spring member 26 included in the evaluation apparatus 1 of the semiconductor device includes a metal. The spring member 26 having such a configuration is hard to break. Ruggedness of the spring member 26 is therefore enhanced.

Moreover, the spring member 26 included in the evaluation apparatus 1 of the semiconductor device includes a resin. The spring member 26 having such a configuration is easily manufactured on a large scale and at low cost.

The tip portion 22 included in the evaluation apparatus 1 of the semiconductor device has the tapered shape tapering toward the main surface 3a of the stage 3. The tip portion 22 having such a configuration can be easily curved at the time of coming in contact with the surface 5a of the semiconductor device 5.

Moreover, the tip portion 22 included in the evaluation apparatus 1 of the semiconductor device further includes the plurality of concave portions 25 in the contact surface 23. According to the above configuration, the tip portion 22 can reliably catch the foreign material at edges of the concave portions 25. As a result, the effect of removing the foreign material is improved. The area of contact with the contact surface 23 is effectively reduced.

Moreover, the insulating body 7 included in the evaluation apparatus 1 of the semiconductor device includes a silicon rubber. According to the above configuration, the insulating body 7 has heat resistance, thus can be used to evaluate the semiconductor device 5 at high temperature. Since an insulating body 7 having low hardness can also be manufactured, a damage of the surface 5a of the semiconductor device, which is to be contacted, can be suppressed.

Moreover, the insulating body 7 included in the evaluation apparatus 1 of the semiconductor device includes a fluorine-contained rubber. According to the above configuration, the insulating body 7 has the heat resistance, thus can be used to evaluate the semiconductor device 5 at high temperature.

Moreover, further provided is the attachment plate 16 for holding the insulating body 7 included in the evaluation apparatus 1 of the semiconductor device. The insulating body 7 is removably fixed to the attachment plate 16. The insulating body 7 having such a configuration can be attached and detached easily. A wide variety of insulating bodies corresponding to the shape or size of the semiconductor device 5, which is to be evaluated, can be mounted.

The insulating body 7 included in the evaluation apparatus 1 of the semiconductor device is fitted into the groove 28 provided in the lower surface of the attachment plate 16, thereby being removably fixed to the attachment plate 16. The insulating body 7 having such a configuration can be attached and detached easily.

The method of evaluating the semiconductor device according to the embodiment 1 is the method of evaluating the semiconductor device 5 using the evaluation apparatus 1 of the semiconductor device described above. The method includes: moving the plurality of probes 10 and causing the plurality of probes 10 to come in contact with the semiconductor device 5 supported by the main surface 3a of the stage 3; moving the insulating body 7 and causing the contact surface 23 of the tip portion 22 to come in contact with the semiconductor device 5; after contacting the contact surface 23, injecting a current into the semiconductor device 5 via the plurality of probes 10 to evaluate electrical characteristics of the semiconductor device 5; and after the evaluation, moving and retracting the insulating body 7 in a direction being away from the semiconductor device 5. In retracting the insulating body 7, the contact surface 23 of the tip portion 22 scrapes against the semiconductor device 5, thereby removing the foreign material located on the semiconductor device 5.

In the method of evaluating the semiconductor device described above, the contact surface 23 provided in the part of the insulating body 7 in the evaluation apparatus 1 comes in contact with the part of the end portion 20, particularly in the side of high potential. Accordingly, the evaluation apparatus 1 effectively increases the creeping distance, thereby suppressing the spark discharge. Furthermore, the insulating body 7 comes in contact not with the entire surface of the end portion 20 or the outer peripheral surface 21 of the semiconductor device 5 but with the part of the end portion 20. Since the area of contact is sufficiently reduced, it is possible to reduce the foreign material or the area of the mark transferred to the surface 5a of the semiconductor device 5 due to the contact of the insulating body 7, thus a defective appearance is suppressed. When the tip portion 22 moves away from the surface 5a of the semiconductor device 5, the foreign material on the surface 5a is removed. As described above, the evaluation apparatus 1 suppresses the foreign material and the transfer of the mark caused by the contact to the surface 5a of the semiconductor device 5.

Embodiment 2

Figure 12:
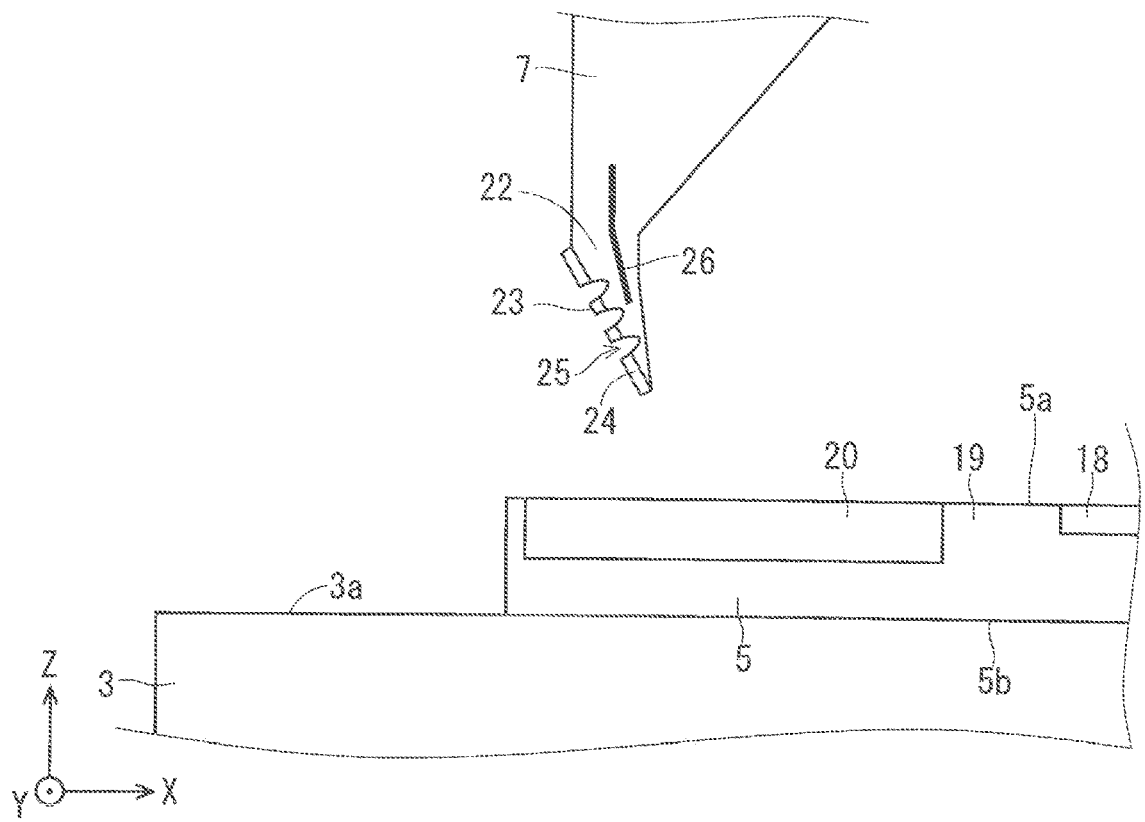
FIG. 12 is a cross-sectional view illustrating a tip portion of an insulating body according to an embodiment 2.

An evaluation apparatus of a semiconductor device according to the embodiment 2 is described. The description of the configuration and operation similar to those of the embodiment 1 is omitted. FIG. 12 is a cross-sectional view illustrating the tip portion 22 of the insulating body 7 included in the evaluation apparatus according to the embodiment 2. In the embodiment 2, the spring member 26 included in the insulating body 7 is provided in the inner side the tip portion 22. Differing from the embodiment 1, one side surface of the tip portion 22 where the contact surface 23 is located is located in the outer side of the frame shape of the insulating body 7. In FIG. 12, the –X direction indicates the outer side of the frame shape of the insulating body 7. Furthermore, the tip portion 22 has a tapered shape slightly curved to the inner side of the frame shape of the insulating body 7 in a state where the tip portion 22 is not in contact with the semiconductor device 5. It is because the tip portion 22 is curved inside and the contact surface 23 can reliably come in contact with the semiconductor device 5 at the time of evaluating the semiconductor device 5.

A protection member 24 is provided on the contact surface 23 of the tip portion 22. The protection member 24 is made of a coating by Teflon (registered trademark) for example, but is not limited thereto. The protection member 24 enhances durability against a repeated contact or improves reliability of the contact.

Figure 13:
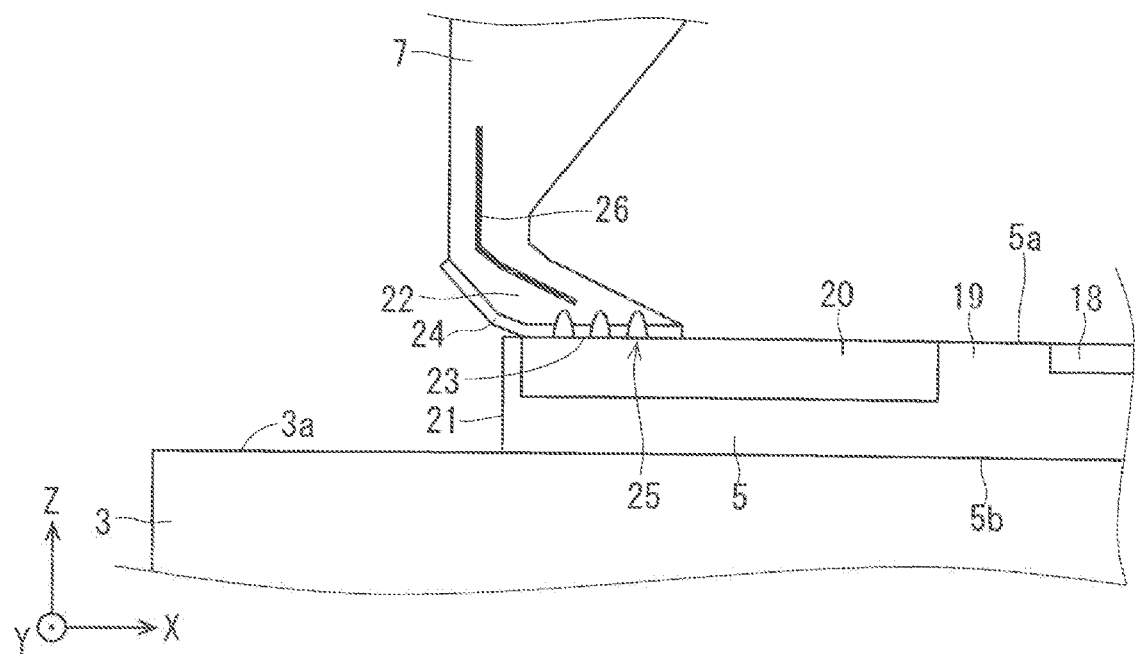
FIG. 13 is a cross-sectional view illustrating the tip portion of the insulating body at a time of the evaluation according to the embodiment 2.

FIG. 13 is a view illustrating a state of the tip portion 22 at the time of evaluating the electrical characteristics of the semiconductor device 5. The tip portion 22 comes in contact with the semiconductor device 5 at the time of the evaluation and then is curved by its flexibility. Its curved direction is the same as a direction toward the inside of the frame shape of the insulating body 7, differing from the embodiment 1. In FIG. 13, a +X direction indicates the inner side of the frame shape of the insulating body 7. The tip portion 22 is deformed toward the inner side of frame shape, thereby the contact surface 23 of the tip portion 22 comes in contact with at least a part of the end portion 20 of the semiconductor device 5. The contact surface 23 of the tip portion 22 is preferably in contact with only the part of the end portion 20 of the semiconductor device 5.

As described above, in the evaluation apparatus of the semiconductor device according to the embodiment 2, the tip portion 22 includes, in one side surface of the tip portion 22, the contact surface 23 which can come in contact with the semiconductor device 5 by the deformation of the tip portion 22 toward the inner side of frame shape. One side surface of the tip portion 22 where the contact surface 23 of the tip portion 22 is located is located outside the frame shape of the insulating body 7. The tip portion 22 included in the evaluation apparatus of the semiconductor device has a tapered shape tilted toward the inner side of the frame shape of the insulating body 7.

In the evaluation apparatus, since the tip portion 22 has the tapered shape tilted toward the inner side, the tip portion 22 sweeps out the foreign material to the outer side of the semiconductor device 5 when the contact surface 23 of the tip portion 22 moves away from the end portion 20. For example, even when the foreign material which has been once caught by the concave portion 25 provided in the contact surface 23 falls from the concave portion 25 onto the surface 5a, the tip portion 22 uses the curve to sweep out the foreign material to the outer side of the semiconductor device 5. Accordingly, the evaluation apparatus of the embodiment 2 suppresses the foreign material remaining on the surface 5a of the semiconductor device 5.

The spring member 26 included in the evaluation apparatus of the semiconductor device according to the embodiment 2 is provided inside the tip portion 22. The spring member 26 provided inside the tip portion 22 is closer to the contact surface 23 than the spring member 26 described in the embodiment 1. Thus, the elasticity provided by the spring member 26 can enable the contact surface 23 to reliably and strongly scrape against the surface 5a of the semiconductor device 5.

Moreover, the insulating body 7 included in the evaluation apparatus of the semiconductor device according to the embodiment 2 further includes the protection member 24 on the contact surface 23 of the tip portion 22. According to the above configuration, in the evaluation apparatus, the protection member 24 prevents a deterioration or contamination, for example, of not only the contact surface 23 of the insulating body 7 but also the surface 5a of the semiconductor device 5.

Embodiment 3

Figure 14:
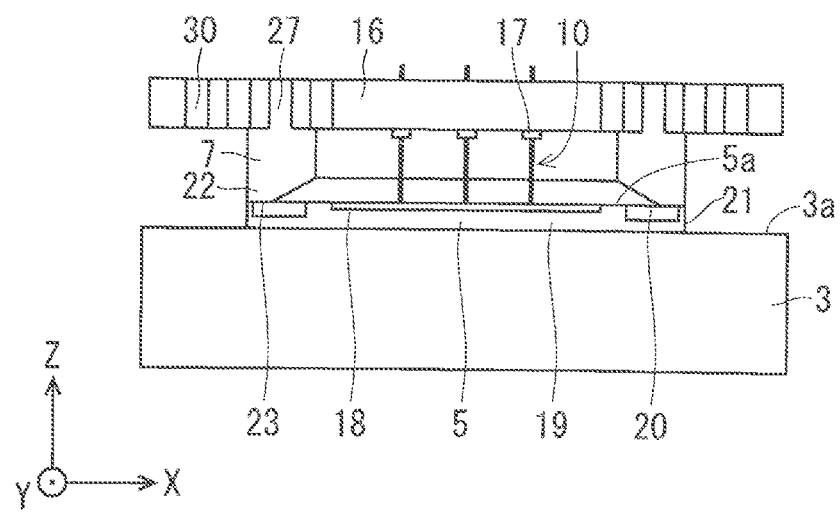
FIG. 14 is a cross-sectional view illustrating a part of an evaluation apparatus at a time of the evaluation according to an embodiment 3.

An evaluation apparatus of a semiconductor device according to the embodiment 3 is described. The description of the configuration and operation similar to those of the embodiment 1 or the embodiment 2 is omitted. FIG. 14 is a cross-sectional view illustrating a configuration around the stage 3 and the attachment plate 16 included in the evaluation apparatus according to the embodiment 3. The insulating body 7 according to the embodiment 3 is fitted into a through hole 30 provided in the attachment plate 16. Thereby, the insulating body 7 is removably fixed to the attachment plate 16. The fitting part 27 having a protruding shape to be fitted into the through hole 30 is provided in the upper part of the insulating body 7, that is to say, the side closer to the attachment plate 16. The mounting of the insulating body 7 using the through hole 30 facilitates the removal of the insulating body 7. That is to say, the insulating body 7 can be detached by pushing the fitting part 27 of the insulating body 7 from the surface of the attachment plate 16 opposite to the surface on which the insulating body 7 is mounted.

Figure 15:
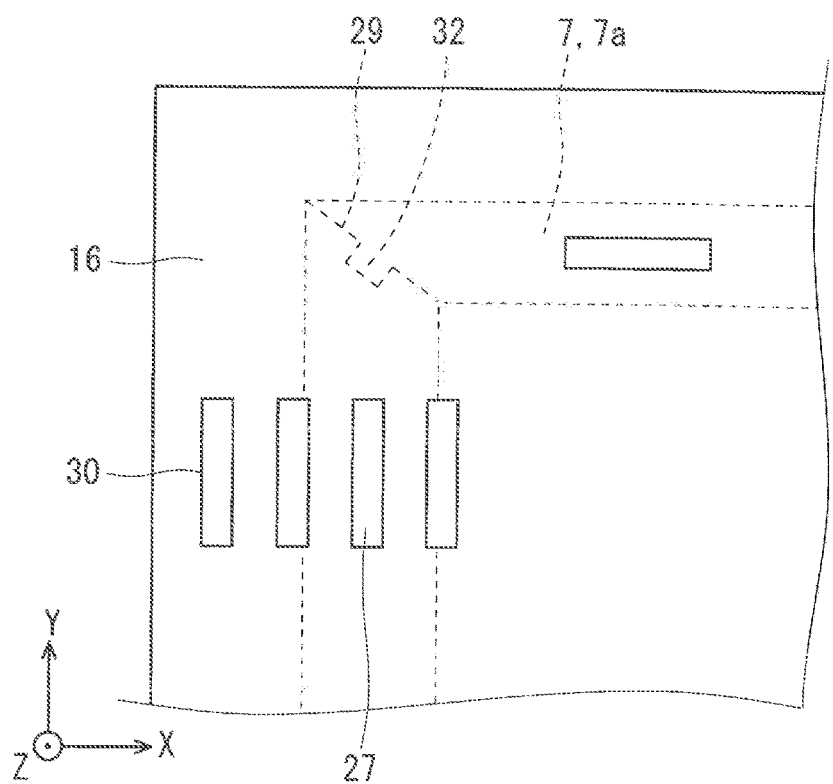
FIG. 15 is a plan view illustrating a part of a probe body according to the embodiment 3.

The through hole 30 does not need to be provided over the entire periphery of the attachment plate 16 to correspond to the frame shape of the insulating body 7. FIG. 15 is a plan view illustrating a part of the attachment plate 16. The through hole 30 is provided in the part of the attachment plate 16 so that the fitting part 27 provided on the upper portion in the part of the outline of the frame shape of the insulating body 7 is fitted into the through hole 30. The through hole 30 may correspond to the fitting part 27 provided only in the part of each insulating part 7a constituting the frame shape of the insulating body 7 in a longitudinal direction, for example. Since the area of the through hole 30 is reduced in the mounting surface of the attachment plate 16 located in the side where the insulating body 7 is provided, a freedom degree of the layout of the electrical wiring in the region having no through hole is enhanced.

As illustrated in FIG. 15, the insulating body 7 includes a fixing part 32 which causes the insulating parts 7a to be fitted into and fixed to each other in the adjacent portion 29 where the insulating parts 7a are in contact with each other. Specifically, a concave part provided in the other insulating part 7a is fitted into a convex part provided in one insulating part 7a. Since the insulating parts 7a constituting the insulating body 7 are fitted into and fixed to each other, an occurrence of a gap between the adjacent portions 29 can be suppressed when the tip portion 22 of the insulating body 7 is pressed to and then comes in contact with the surface 5a of the semiconductor device 5. The position of the fixing part 32 fitted in the manner described above is preferably located close to the semiconductor device 5 at the time of the evaluation. It is because the position where the gap described above needs to be avoided is located near the semiconductor device 5 whose creeping distance needs to be elongated. The insulating body 7 may include a plurality of fixing parts 32 in one adjacent portion 29.

Embodiment 4

Figure 16:
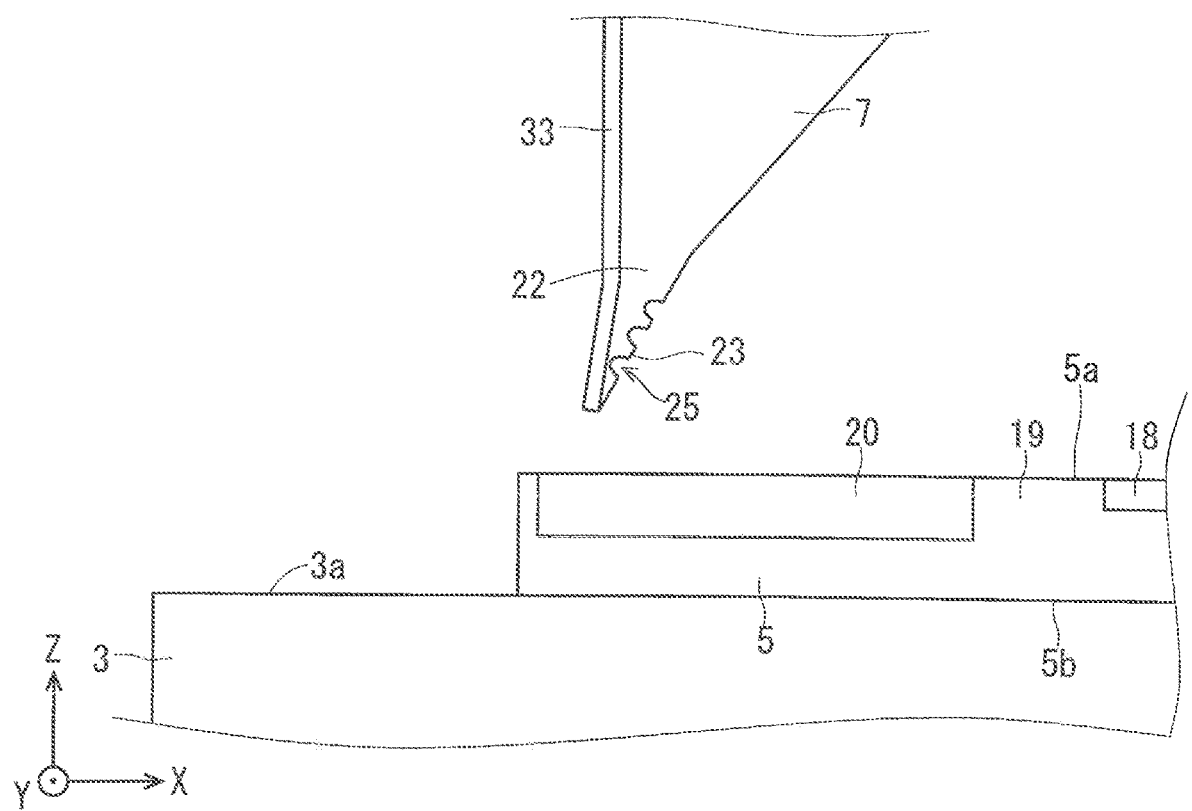
FIG. 16 is a cross-sectional view illustrating a tip portion of an insulating body according to an embodiment 4.

An evaluation apparatus of a semiconductor device according to the embodiment 4 is described. The description of the configuration and operation similar to those of any of the embodiments 1 to 3 is omitted. FIG. 16 is a cross-sectional view illustrating the tip portion 22 of the insulating body 7 included in the evaluation apparatus according to the embodiment 4. The insulating body 7 according to the embodiment 4 includes at least one elastic part 33 instead of the spring member 26. At least a part of the elastic part 33 is provided on the other side surface opposite to one side surface of the tip portion 22 where the contact surface 23 is located. The elastic part 33 is formed by adding an elastic material having hardness different from that of the tip portion 22. For example, the elastic part 33 is formed by joining the elastic material to the side surface of the tip portion 22. The elastic material is harder than the insulating body 7, particularly the tip portion 22. Moreover, the elastic material has insulating properties. The elastic part 33 provides the elasticity to the tip portion 22, thereby bringing the deformed tip portion 22 back into the original state. The elastic material needs to have the hardness different from that of the insulating body 7 or the tip portion 22, but is preferably made of a material of the same type. The material of the same type can be joined more easily than a material of a different type. Moreover, a separation at a time of disposal is simplified. However, the elastic material is not limited to the material of the same type.

In the evaluation apparatus including the above configuration, the curve, that is to say, the deformation of the hard elastic part 33 is released at the time of removing the insulating body 7 away, thereby the contact surface 23 reliably scrapes against the surface 5a of the semiconductor device 5. As a result, the effect of removing the foreign material is improved.

According to the present invention, the above embodiments can be arbitrarily combined, or each embodiment can be appropriately varied or omitted within the scope of the invention. Although the present invention has been shown and described in detail, the foregoing description is in all aspects illustrative and not restrictive. Various modifications not exemplified are construed to be made without departing from the scope of the present application.

What is claimed is:

1. An evaluation apparatus of a semiconductor device, comprising: a stage configured to support a semiconductor device on a main surface; a plurality of probes being located above said main surface of said stage; an insulating body having a frame shape to surround said plurality of probes and being located above said main surface of said stage; and an evaluation part being connected to said plurality of probes and said main surface of said stage and injecting a current into said semiconductor device supported by said main surface of said stage via said plurality of probes to evaluate electrical characteristics of said semiconductor device, wherein said insulating body includes a tip portion having flexibility and facing said main surface of said stage, said tip portion includes, in one side surface of said tip portion, a contact surface contactable with said semiconductor device by a deformation of said tip portion toward an inner side or an outer side of said frame shape, and said insulating body further includes at least one spring member having a plate-like shape and included in said tip portion to provide elasticity to said tip portion, thereby bringing a deformation of said tip portion back into an original state.

2. The evaluation apparatus of the semiconductor device according to claim 1, wherein
said frame shape of said insulating body is formed by combining a plurality of insulating parts.

3. The evaluation apparatus of the semiconductor device according to claim 1, wherein
said tip portion is made of an elastic body.

4. The evaluation apparatus of the semiconductor device according to claim 1, wherein
said insulating body further includes an elastic part providing elasticity to said tip portion, thereby bringing a deformation of said tip portion back into an original state, and
said elastic part is formed by adding an elastic material having hardness different from hardness of said tip portion on another side surface opposite to said one side surface of said tip portion where said contact surface is located.

5. The evaluation apparatus of the semiconductor device according to claim 1, wherein
said spring member is provided inside said tip portion.

6. The evaluation apparatus of the semiconductor device according to claim 1, wherein
said spring member is provided on another side surface opposite to said one side surface of said tip portion where said contact surface is located.

7. The evaluation apparatus of the semiconductor device according to claim 1, wherein
said spring member has a shape in which at least one first rectangle and at least one second rectangle having a larger area than an area of said first rectangle are alternately connected to each other in a surrounding direction of said frame shape of said insulating body.

8. The evaluation apparatus of the semiconductor device according to claim 7, wherein
said insulating body further includes a plurality of said spring members,
said frame shape of said insulating body is formed of a plurality of sides, and
each spring member is provided on each side and has a shape in which a third rectangle having an area larger than an area of said second rectangle is connected to both ends thereof.

9. The evaluation apparatus of the semiconductor device according to claim 1, wherein
said insulating body further includes a plurality of said spring members,
said frame shape of said insulating body is formed of a plurality of sides, and
each of said spring members is provided only in an end of each side.

10. The evaluation apparatus of the semiconductor device according to claim 1, wherein
said insulating body further includes a plurality of said spring members,
said frame shape of said insulating body is formed of a plurality of sides,
and each of said spring members is provided only in a central part of each side.

11. The evaluation apparatus of the semiconductor device according to claim 1, wherein
said tip portion has a tapered shape tapering toward said main surface of said stage.

12. The evaluation apparatus of the semiconductor device according to claim 11, wherein
said tip portion has said tapered shape tilted toward an inner side of said frame shape of said insulating body, and
said one side surface of said tip portion where said contact surface is located is located in an outer side of said frame shape of said insulating body.

13. The evaluation apparatus of the semiconductor device according to claim 1, wherein
said tip portion further includes a plurality of concave portions in said contact surface.

14. The evaluation apparatus of the semiconductor device according to claim 1, wherein
said insulating body further includes a protection member on said contact surface of said tip portion.

15. A method of evaluating a semiconductor device using the evaluation apparatus of the semiconductor device according to claim 1, comprising:

moving said plurality of probes and causing said plurality of probes to come in contact with said semiconductor device supported by said main surface of said stage;

moving said insulating body and causing said contact surface of said tip portion to come in contact with said semiconductor device;

after contacting said contact surface, injecting a current into said semiconductor device via said plurality of probes to evaluate electrical characteristics of said semiconductor device;

and after said evaluation, moving and retracting said insulating body in a direction being away from said semiconductor device, wherein in retracting said insulating body, said contact surface of said tip portion scrapes against said semiconductor device, thereby removing a foreign material located on said semiconductor device.

16. An evaluation apparatus of a semiconductor device, comprising: a stage configured to support a semiconductor device on a main surface; a plurality of probes being located above said main surface of said stage; an insulating body having a frame shape to surround said plurality of probes and being located above said main surface of said stage; an evaluation part being connected to said plurality of probes and said main surface of said stage and injecting a current into said semiconductor device supported by said main surface of said stage via said plurality of probes to evaluate electrical characteristics of said semiconductor device, and an attachment plate holding said insulating body, wherein said insulating body includes a tip portion having flexibility and facing said main surface of said stage, said tip portion includes, in one side surface of said tip portion, a contact surface contactable with said semiconductor device by a deformation of said tip portion toward an inner side or an outer side of said frame shape, and said insulating body is removably fixed to said attachment plate.

17. The evaluation apparatus of the semiconductor device according to claim 16, wherein
said insulating body is fitted into a groove provided in a lower surface of said attachment plate, thereby being removably fixed to said attachment plate.

18. The evaluation apparatus of the semiconductor device according to claim 16, wherein
said insulating body is fitted into a through hole provided in said attachment plate, thereby being removably fixed to said attachment plate.

19. The evaluation apparatus of the semiconductor device according to claim 18, wherein
said through hole is provided in a part of said attachment plate so that a fitting part provided in a part of an outline of said frame shape of said insulating body is fitted into said through hole.

* * * * *